United States Patent
Ellis et al.

(10) Patent No.: US 6,826,100 B2
(45) Date of Patent: Nov. 30, 2004

(54) PUSH BUTTON MODE AUTOMATIC PATTERN SWITCHING FOR INTERCONNECT BUILT-IN SELF TEST

(75) Inventors: David G. Ellis, Tualatin, OR (US); Bruce Querbach, Orangevale, CA (US); Jay J. Nejedlo, Wilsonville, CA (US); Amjad Khan, Folsom, CA (US); Sean R. Babcock, Portland, OR (US); Eric S. Gayles, Folsom, CA (US); Eshwar Gollapudi, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 13 days.

(21) Appl. No.: 10/404,405

(22) Filed: Mar. 31, 2003

(65) Prior Publication Data

US 2004/0117707 A1 Jun. 17, 2004

Related U.S. Application Data

(63) Continuation-in-part of application No. 10/319,517, filed on Dec. 16, 2002.

(51) Int. Cl.⁷ .............................................. G11C 7/00
(52) U.S. Cl. ...................... 365/201; 714/715; 714/738
(58) Field of Search ............................ 365/201, 189.05; 714/715, 738, 763

(56) References Cited

U.S. PATENT DOCUMENTS 6,477,674 B1 * 11/2002 Bates et al. .................. 714/738
6,609,221 B1 * 8/2003 Coyle et al. ................. 714/715

OTHER PUBLICATIONS

U.S. patent application Ser. No. 10/393,223, Nejedlo, filed Mar. 20, 2003.
U.S. patent application Ser. No. 10/224,492, Tripp et al., filed Aug. 21, 2002.

* cited by examiner

Primary Examiner—Son T. Dinh
(74) Attorney, Agent, or Firm—Blakely, Sokoloff, Taylor & Zafman LLP

(57) ABSTRACT

A built-in self test (BIST) unit, of a primary integrated circuit (IC) component of a computer system, is programmed or hardwired with a test pattern. The test pattern is launched in multiple test cycles, to test an interconnect bus of the computer system or perform a device validation test of the component. A pin assignment of the pattern is automatically changed after each test cycle, without requiring re-programming of the BIST unit to do so.

17 Claims, 4 Drawing Sheets

… (1) …

PUSH BUTTON MODE AUTOMATIC PATTERN SWITCHING FOR INTERCONNECT BUILT-IN SELF TEST

RELATED PATENT APPLICATIONS

This application is a continuation-in-part of U.S. application Ser. No. 10/319,517 filed Dec. 16, 2002 entitled "Testing Methodology and Apparatus for Interconnects" (pending) (P13588).

U.S. application Ser. No. 10/393,223 filed Mar. 20, 2003 entitled, "A Reusable, Built-In Self Test Methodology for Computer Systems" (pending) (P16154).

BACKGROUND

The invention is related to methodologies for testing computer systems and their integrated circuit (IC) components, during and after manufacture, to determine whether their electrical specifications have been met as well as that they have been assembled correctly.

Industry trends for high performance computer systems, such as those that use a Pentium processor and an associated chipset by Intel Corp., Santa Clara, Calif., are towards faster product cycle times (time to market) with sustained high quality. At the same time, component to component bus speeds are increasing beyond several GHz, and printed wiring board densities are increasing, to meet the need for greater performance. These demands are rendering conventional testing techniques such as oscilloscope and logic analyzer probing less reliable, or even impossible, on high speed interfaces, both in the high volume mnanufacturing setting as well as earlier in the electrical validation and verification-setting.

At the board and platform level, the system has its primary components, including the processor, system chipset, and memory, installed on a motherboard. In that stage of manufacturing, transaction-based tests have been used, in a board or platform high volume manufacturing setting, to verify a wide range of storage and logic functions of the system. Such tests evaluate whether the memory subsystem and the I/O subsystem work according to their electrical specifications. The test is performed by the processor executing a special test routine, during or after booting an operating system (OS) program, that causes test patterns that are part of the test routine to be written to and then read from addresses that span the computer system. However, faults of a high frequency type (such as due to cross talk between adjacent signal lines and inter-symbol interference (ISI) due to transmission line effects) cannot be detected or isolated using such techniques, due to the coarse test granularity and high instruction overhead associated with running an OS-based test program.

Another type of computer system test calls for the processor to execute firmware/software that operates at a lower level than an OS-based program, prior to booting the operating system. These include basic I/O system (BIOS) and extended firmware interface (EFI) programs. Although these types of tests provide relatively low-level, and hence more accurate, control of component functionality and interconnect buses, system interactions cannot be stressed to their bandwidth specifications in such tests. In addition, the ability of BIOS/EFI tests to isolate a fault with sufficient granularity is also limited.

Finally, there is a low level technique known as boundary scan testing (or the joint Test Access Group, JTAG, protocol) which calls for on-chip circuitry used to control individual bits transmitted between components. Once again, however, there is no provision for testing high frequency faults. For example, a boundary scan test may detect "opens" and "shorts" while running at a 10 MHz clock, whereas normal signaling speed on the interconnect will be in the GHz range.

The related applications identified above, which are assigned to the same assignee as that of this application, namely Intel Corp., describe an interconnect built-in self test (IBIST) methodology. That solution addresses some of the shortcomings of conventional computer system testing, e.g. isolating high-speed faults of chip to chip interconnects. As mentioned in those applications, a BIST unit, which resides in an IC component of the system and is separate in function from the core, may be provided with a control interface (e.g. JTAG; System Management Bus (SMBus)). This permits configuration and programming (e.g. via a tester external to the computer system board and platform; on-board system firmware or basic I/O system (BIOS) programming) of an IBIST test pattern. In that case, a separate, victim-aggressor test pattern may be launched by the BIST unit, to the external pins of its associated IC component, in each cycle of a test session. Using the control interface, a victim pin assignment can be changed for each cycle, by reprogramming a pattern register of the BIST unit with a different victim-aggressor pattern.

BRIEF DESCRIPTION OF THE DRAWINGS

The invention is illustrated by way of example and not by way of limitation in the figures of the accompanying drawings in which like references indicate similar elements. It should be noted that references to "an" embodiment of the invention in this disclosure are not necessarily to the same embodiment, and they mean at least one.

DETAILED DESCRIPTION

It has been discovered that the reprogramming of a BIST pattern register after each cycle of an IBIST test session, where for example only one bit or pin of a parallel connection is tested in each cycle, can significantly lengthen the total test time. As explained below, a solution may be to provide for the automatic changing of the test pattern by BIST hardware. Before discussing the details and examples of this so-called "push button mode" capability of the BIST unit, a description of a computer system of which a BIST-enhanced component is to be a part will be given.

Figure 1:
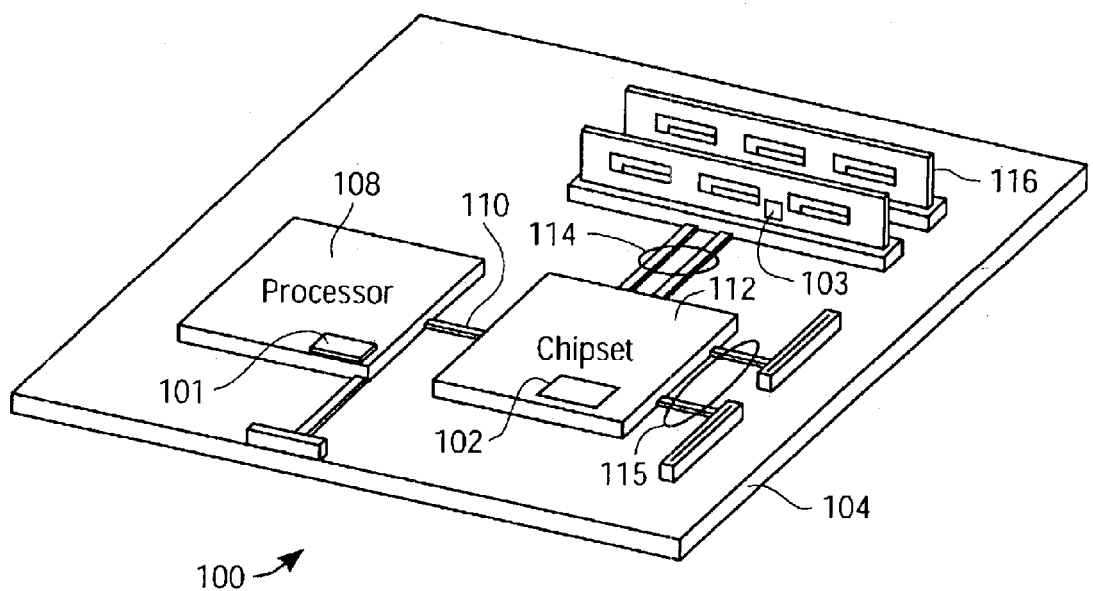
FIG. 1 is a block diagram of an example computer system that has been enhanced with BIST units in its primary IC components.

FIG. 1 is a block diagram of an example computer system 100 enhanced with BIST units 101, 102, and 103. The BIST units 101–103 are associated with their respective core function circuitry (not shown in FIG. 1) and are located in the primary IC components of the system 100. The primary IC components in this case include a processor 108 (e.g. a Pentium processor by Intel Corp.), a system interface or chipset 112, and memory subsystem hardware 116. The BIST units 101–103 may be integrated into a primary IC component package or module, such as a separate chip within a multi-chip module. A BIST unit may alternatively be located on-chip with the processor or chipset core circuitry. The BIST unit may be implemented as a state machine with configuration registers that are accessible from outside its component. These components are to be used as part of a production version of the system 100, a high volume manufacturing (HVM) specimen.

The primary IC components of the system 100 communicate with each other using interconnects. In this case, the interconnects include a processor bus 110 and memory interface bus 114 formed in a carrier substrate 104. Both of those buses may be parallel buses. For example, the processor 108, chipset 112, and bus 110 may be designed for a Front Side Bus protocol by Intel Corp., to run at nominal bus speeds of over five hundred (500) MHz bus clock frequency.

In addition to the parallel buses, the system 100 also has a high-speed serial interface 115, which can be tested via the BIST unit 102 of the chipset 112. In this case, the serial interface 115 is also formed in the same carrier substrate 104 (e.g. a motherboard; a daughter card), and is part of the I/O subsystem of the computer system 100. The chipset 112 and serial interface 115 may be designed according to the Peripheral Component Interconnect (PCI) Express standard described in PCI Express Specification 1.0 and PCI Express Card Electro Mechanical Specification which are available from the PCI Special Interest Group, Portland, Oreg. Of course, primary IC components and computer system architectures other than those depicted in FIG. 1 can also be enhanced with BIST units.

Figure 2:
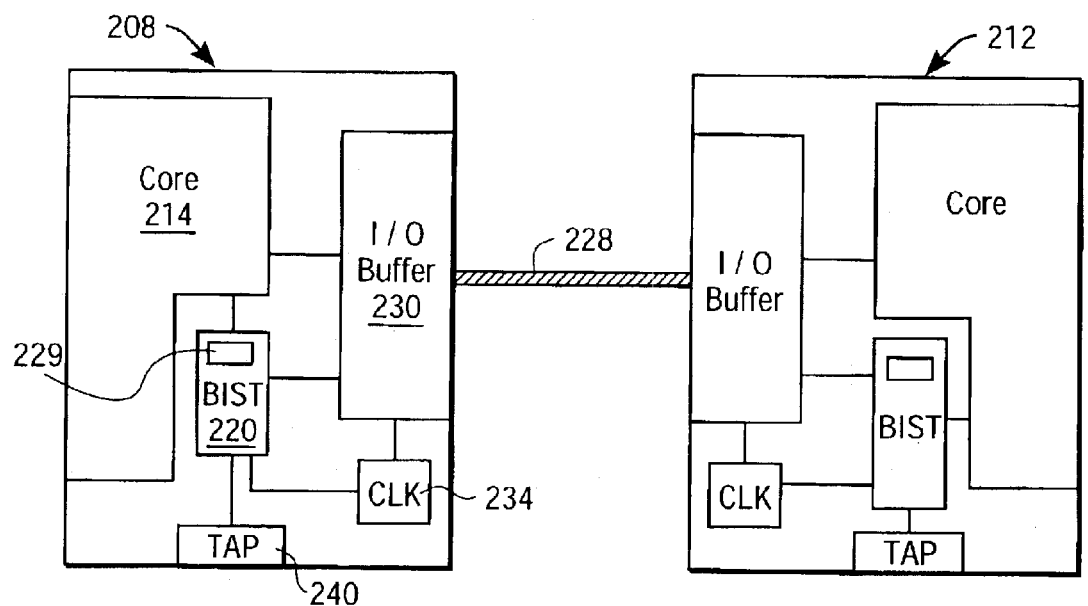
FIG. 2 is a block diagram that illustrates, in more detail, a part of the computer system in which a pair of BIST-enhanced, primary IC components are connected via a parallel bus.

FIG. 2 is a block diagram that illustrates, in more detail, a part of a BIST-enhanced computer system 200. The following description of the component 208 also applies to another component 212, unless otherwise noted. In the component 208, both the core function circuitry 214 and the BIST unit 220 are coupled to control an interconnect bus 228 through the same I/O buffer circuitry 230. During normal operation, the core function circuitry 214 may act as a bus agent and communicates with other bus agents at a nominal bus speed, set by or regulated by clock circuitry 234. The I/O buffer circuitry 230 receives and responds to bus control and other information elements (e.g. address; data; control) from the core function circuitry 214 (which may be that of a processor, chipset, or memory subsystem hardware), at the nominal bus speed. However, upon system or component power-up, and during special test modes, the BIST unit 220 may be requested to take full control of the bus 228, through the I/O buffer circuitry 230. The BIST unit 220 thus uses the same on-chip, logic-to-transmission-line signal interface as the core function circuitry 214, namely the I/O buffer circuitry 230. In addition, information elements provided by the BIST unit 220 may be launched and captured at the same, nominal bus speed. The BIST unit 220 thus experiences the same signal paths and timing delays as the core function circuitry 214 when launching and capturing information elements on the bus 228. This yields a more effective test methodology, particularly for isolating faults due to high speed operation, including faults such as intersymbol interference, crosstalk, power delivery faults due to improper power supply decoupling and noise filtering, and power supply resonances.

The BIST unit 220 may be equipped with an IBIST cell 229 that is responsible for performing an interconnect test of a number of external pins of the component 208 and/or the bus 228. For example, the IBIST cells associated with two bus agents (e.g. components 208 and 212) connected by a parallel bus may first be configured (e.g. programmed) with the same victim-aggressor bit pattern. One BIST cell is configured as a test master, while the other is configured as a test slave. The master starts a test session by launching the bit pattern. The pattern may define the signal level and timing for a number of bits. For example, there may be one victim bit surrounded by multiple, neighboring aggressor bits plus some idle bits. The aggressor bits may be designed to switch during the cycle, at nominal bus speed for instance, in such a way that simulates the worse case scenario for inducing cross interference in the victim bit (which may or may not be switching simultaneously). A sequence of pre-defined values driven on the victim pin, possibly at nominal bus speed, is then captured by the test slave and compared to its copy of the pattern, to determine any differences (hence, errors). Note that synchronization on the bus, between components that are using an IBIST pattern generator, may be accomplished in the same manner as that of normal operation involving the core function circuitry of multiple bus agents. For example, the bus clock may be used for common clock signaling and strobes may be used for source synchronous transmissions.

Still referring to FIG. 2, the IBIST cell may be configured or programmed via a test access port (TAP) 240 of the component. This permits configuration and programming (e.g. via JTAG or computer system firmware) of an IBIST test pattern. As mentioned in the background, using the JTAG protocol, a victim pin assignment can be changed for each cycle of a test session, by serially scanning into a pattern register of the IBIST cell a different victim-aggressor pattern after each cycle.

However, a more efficient procedure is to avoid this external reprogramming or reconfiguration operation after each cycle, by designing a state machine or other logic structure in a BIST unit to automatically change the victim pin assignment after each cycle, in hardware. This allows a different victim-aggressor pattern to be launched and captured in each cycle of the test session. Such a BIST unit may thus be said to support a "push button mode" where, once the IBIST test session is started, the victim-aggressor assignment in an initial or pre-configured test pattern is automatically switched from cycle to cycle. This is performed so that every pin or signal of a given bus segment is subjected to victim status, without having to scan in (via the test access port) a different victim-aggressor pattern after each cycle. The time savings becomes more significant in cases where only one victim pin is evaluated in each cycle and the number of pins or signals defined in the bus segment, as well as perhaps the cycle time, increase. It should be noted that although the initial victim-aggressor pattern can be programmed into the BIST unit (e.g. via JTAG; via system management platform firmware executing on the motherboard or platform), the initial pattern may alternatively be hardwired into the BIST unit, so that the BIST unit can "self boot" the IBIST test session upon its component receiving power.

Figure 3:
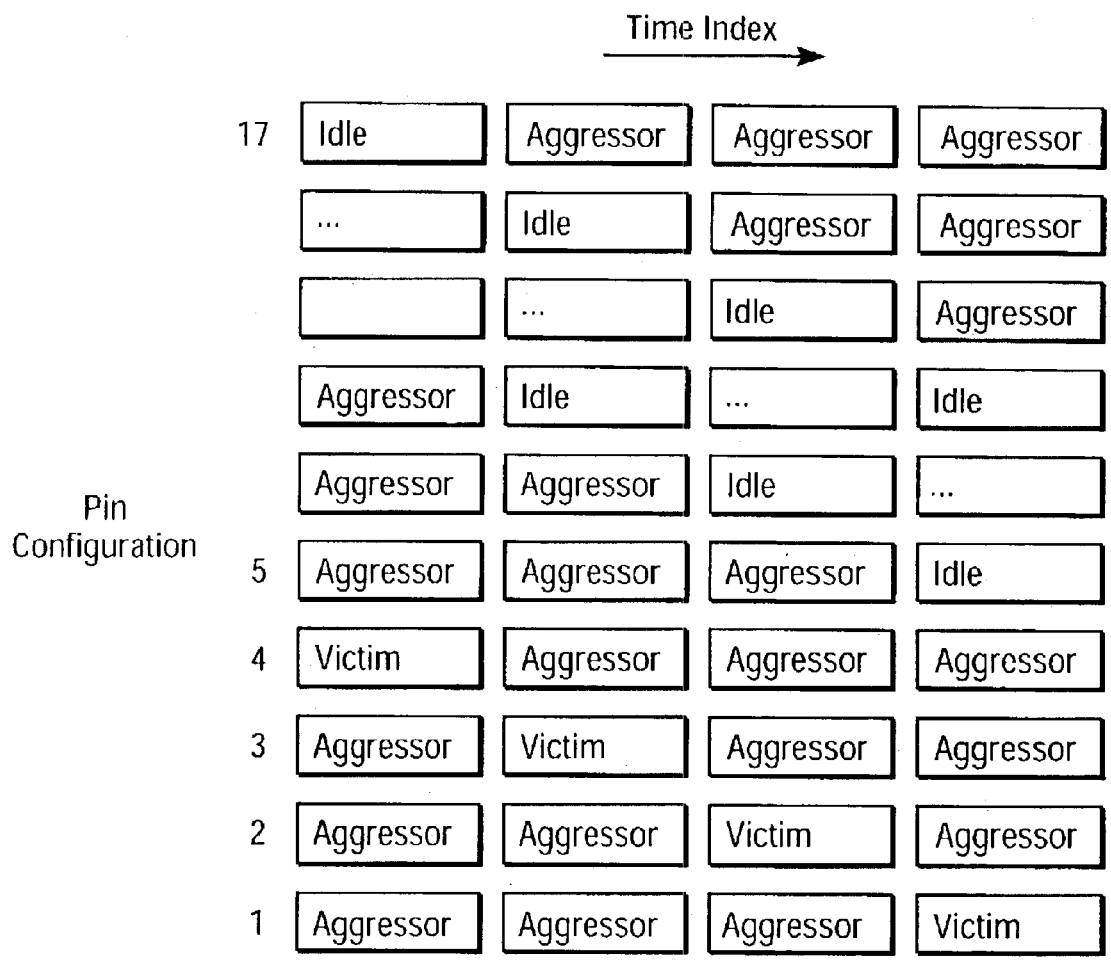
FIG. 3 is a conceptual diagram of an example, changing victim-aggressor pattern that can be applied by an IBIST cell to the external pins of its IC component.

FIG. 3 is a conceptual diagram of an example, changing victim-aggressor pattern. In this example, a segment of seventeen (17) bus signals are shown, with a single victim surrounded on either side by up to three aggressors and the rest being idle. Other patterns (including multiple victim pins) and bus segment sizes are of course possible. Note how the single victim pin in this embodiment shifts downward, by one bit in each cycle. This may be accomplished using a circular shift register that can shift/rotate an otherwise static group of bits by one bit after each cycle. An alternative and more flexible approach is to provide a table of different, static bit groups, where for each cycle of the test session a different static bit group is selected from the table automatically, to represent the victim-aggressor pattern.

Figure 4:
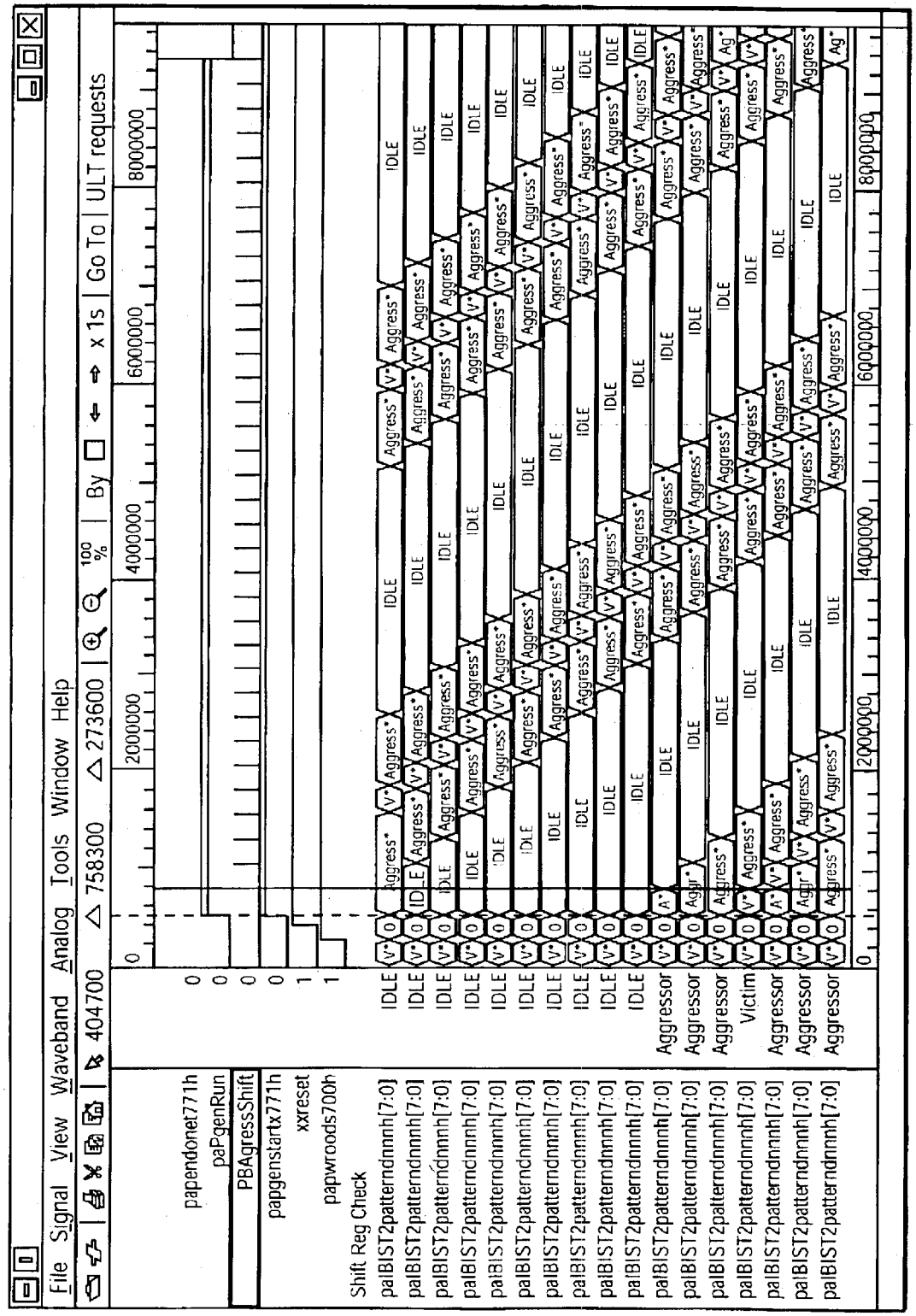
FIG. 4 is a timing diagram of an example IBIST test session, showing the automatically changing victim-aggressor pattern.

Turning now to FIG. 4, what is shown there is a timing diagram of a method for operating an example IBIST test session. In this example, there are seventeen (17) logic waveforms that correspond to an equal number of bus signals driven by a BIST cell, plus six (6) control signals involved in the methodology. The process begins with a power good signal, papergoods, being asserted by the IC component upon power-up. Then, the pattern registers (not shown) for the group of 17 pins are configured as one victim surrounded by three aggressors on each side, with the rest idle. Next, a component reset signal, xxreset_, is asserted by the component, signifying that clock synchronization has been achieved in the component. The test session then begins with the assertion of papgenstartx. Each time a pin has been tested as a victim in a given cycle, the control signal PBAgressShift asserts. In this embodiment, each assertion of PBAgressShift shifts the pattern over by one pin. Finally, after each pin of the group has had the chance to be a victim, the test session terminates by deassertion of paPgenRun and assertion of papgendone.

Any error that occurs during the push button mode test can be captured by a "sticky" error bit, for each pin. The error status may then be scanned out of the slave BIST unit of a component via, for example, a serial scan (boundary scan) chain, or read from a control status register of the component, through the test access port 240 (see FIG. 2).

Figure 5:
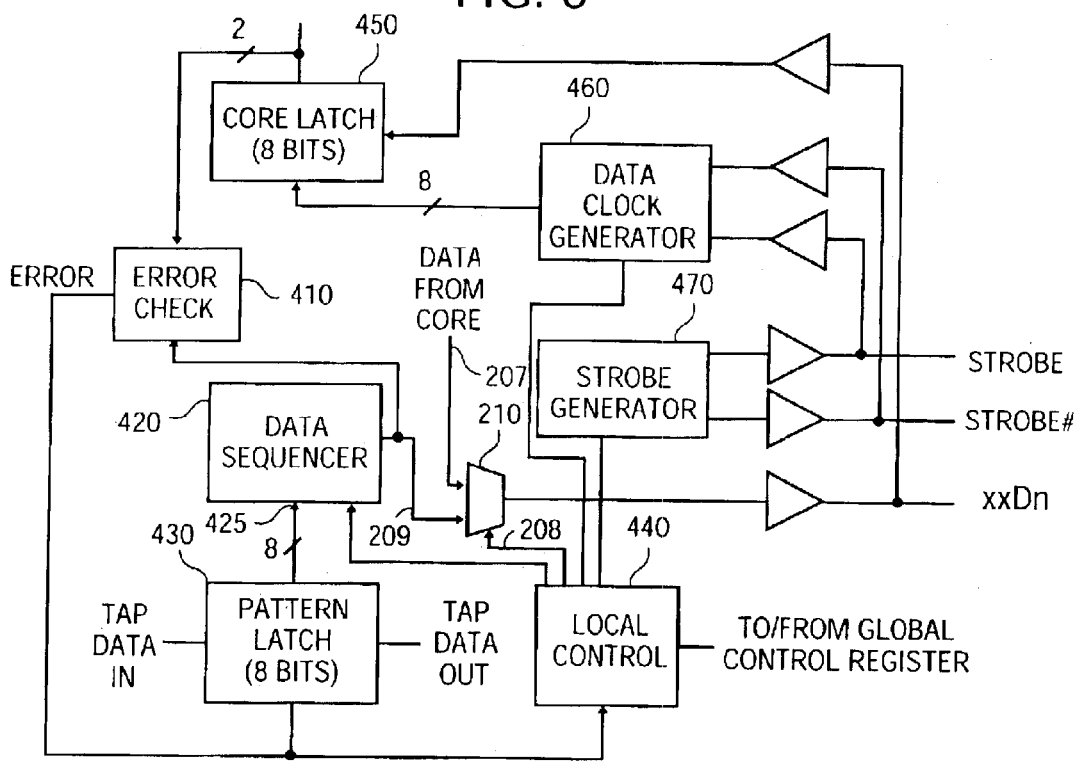
FIG. 5 is a circuit schematic of part of an example IBIST cell.

Referring now to FIG. 5, a circuit schematic of part of an example IBIST cell 229 (see FIG. 2) is shown.

Each component (such as processors, memory hubs, buffers, etc.) integrating the IBIST architecture may contain an N bit pattern latch 430, a bit (or data) sequencer 420, an error checking logic device 410 and local control 440. The data passes through the multiplexer 210 and is sent across the bus (shown as data line xxDn in FIG. 5). That is, data may be transmitted along data line xxDn to the bus (for transmission to another component). FIG. 5 only shows a single pad connection (or single bit) to the bus although the system may have other pad connections to the bus. These other pad connections are not shown for ease of illustration. In the FIG. 5 illustration, N corresponds to 8. Other values of N are also within the scope of the invention.

The circuit diagram also includes circuit elements that are common to a normal processor operating by use of a source synchronous bus, i.e. part of the core function circuitry. These elements include a core latch 450 to receive bits from the core (not shown), a data clock generator 460, a strobe generator 470 and buffers. The strobe generator 470 may be responsible for providing the strobe synchronous signals Strobe and Strobe#. These components operate in a normal manner by use of the strobe synchronous signals Strobe and Strobe#. Additionally, data may be received along data line xxDn and fed to the core latch 450 through one of the buffers.

The N bit pattern latch 430 may be a serial/parallel latch that is in a user defined, private scan chain. Each I/O buffer (such as those shown in FIG. 2) may be coupled to this chain in a serial fashion. As mentioned above, the functionality of a circular shift register may be incorporated into the latch 430, so that the pre-configured pattern is rotated by one or more bits in every cycle.

The pattern latch 430 may be clocked by a Test Access Port (TAP) clock for serial scan in/out operation. The pattern latch 430 may also have a parallel load clock for loading data to be scanned out. The N bit pattern to be sent or received from the bus (or other type of interconnect) may be shifted into the pattern latch 430. Each parallel output from the pattern latch 430 may be output to the bit sequencer 420 along signal lines 425. Controls of the bit sequencer 420 may be coupled by signal lines (such as three lines) to a pattern state machine provided within the local control 440. These control signals may be decoded in the bit sequencer 420 to select one of N bits of pattern data to be sent out to the pad (of the bus) in a transmit mode or to be sent to the error logic in a receive mode. The error checking logic device 410 may be coupled to both the output of the pattern sequencer 420 and the core data latch 450.

Error checking may be done by the error checking device 410 (FIG. 5) during/subsequent to a pattern transfer. The error checking may be done on a bit by bit basis. Once the error checking device 410 has determined that an error has occurred in the transferred pattern, the pattern latch 430 may be latched for an entire pattern transfer and the error checking device 410 may report the error in real time. The error bit in each latch may be sent to the pattern latch 430 so that the error condition of each latch can be scanned out of the pattern latch 430 at the end of a pattern transfer to determine the I/O buffer having the error condition. This error condition may represent an error of the interconnect associated with that buffer. The error bits from each I/O buffer may also be coupled to the local control 440 for each bus group. An error signal may be sent to the local control 440 to record when a first error occurs in the pattern transfer. This pattern data may be scanned out of registers within the local control 440. The error signals from each local control 440 may be coupled to an error bit in a global control register that enables monitoring of this register to check error conditions after and/or during each test.

The local control 440 may contain a pattern sequencing state machine and various counters (or registers) that control pattern transfers on the bus. The state machine may operate in both a transmit mode and a receive mode. The state machine may send the sequence control data bits to each buffer to be decoded by the pattern sequencers (such as the pattern sequencer 420). The counters within the local control 440 may determine how many times an N bit pattern is transferred. This may be used to control operation of the state machine.

Global control circuitry (not shown) may include a control register for the entire pattern generator. The control register may be included in the pattern generator scan chain. The register may contain a global start/stop bit, a global error bit, and bits needed to define the direction (transmit or receive) of testing for each associated local control.

To summarize, various embodiments of a built-in self test methodology for computer systems have been described. In the foregoing specification, the invention has been described with reference to specific exemplary embodiments thereof. It will, however, be evident that various modifications and changes may be made thereto without departing from the broader spirit and scope of the invention as set forth in the appended claims. For example, the reference to a "computer system" is not intended to be limited to general purpose (e.g. personal) computers but rather encompasses any digital system board or platform that could benefit from the above described test methodology. In addition, the test methodology may be applied to test not only multi-drop buses but also the point-to-point variety. Also, the BIST methodology for testing a system interconnect may also be used for device validation, in particular to test the connection and circuitry between the core function circuitry and the external pins of a component, before or after proper operation of the core function circuitry has been verified. The specification and drawings are, accordingly, to be regarded in an illustrative rather than a restrictive sense.

What is claimed is:

1. A system comprising:

a carrier substrate;

a bus formed in the carrier substrate; and first and second agents to communicate with each other at a nominal bus speed via the bus, the first agent having a built-in test unit separate from that agent's core function circuitry to launch test information, contained in each of a plurality of test cycles as a victim-aggressor pattern, on said bus at said nominal bus speed, the second agent having a built-in test unit, separate from that agent's core function circuitry, to capture said information over the bus and compare said captured test information to a copy of said test information stored in the second agent to determine any errors, the test unit of the first agent to automatically change a victim pin assignment after each test cycle, without requiring re-programming of the test unit by a test program that is external to the first agent.

2. The system of claim 1 wherein the first and second agents are intended to be used as part of a production version of the system.

3. The system of claim 1 wherein the bus is a point to point bus.

4. The system of claim 1 wherein the bus is a parallel bus and the carrier substrate is a printed wiring board.

5. The system of claim 1 wherein the first and second agents are to communicate with each other at a nominal bus clock frequency greater than 500 MHz.

6. The system of claim 1 wherein the bus is a parallel bus, the carrier is a printed wiring board, the first agent is a processor, the second agent is a system chipset, and the system is a high volume manufacturing specimen.

7. A method comprising:

launching a victim-aggressor test pattern in each of a plurality of test cycles, to test at nominal bus speed an interconnect bus of a computer system, said test pattern having been one of programmed and hardwired into a built-in self test unit of a primary integrated circuit (IC) component of the computer system; and automatically changing a victim pin assignment after each of said plurality of test cycles, without requiring re-programming of the test unit.

8. The method of claim 7 wherein the victim pin assignment is changed by one of (a) shifting the victim-aggressor test pattern by one bit after each test cycle and (b) accessing a table of said test unit to obtain a different victim-aggressor test pattern.

9. The method of claim 7 wherein the nominal bus speed is at least five hundred (500) MHz.

10. The method of claim 7 wherein the test unit is programmed via one of (a) a boundary scan test procedure and (b) a programmatic register interface.

11. An article of manufacture comprising:

a primary integrated circuit (IC) component of a computer system, the component being intended for use as part of a production version of the system, the component having a built-in test unit and core function circuitry that are coupled to transfer information over the same I/O buffer circuitry of the component, the test unit being pre-configured to apply a test pattern, via the I/O buffer circuitry and independent of a bus protocol that is to be used by the core function circuitry during normal operation of the system, to test a plurality of pins of the component, and to automatically change the test pattern during a test session.

12. The article of claim 11 wherein the test unit is to automatically change a victim pin assignment to cover every one of the plurality of pins in the test session, without a serial scan, pattern re-configuration operation.

13. The article of manufacture claim 12 wherein the test unit has a circular shift register to be loaded with a victim-aggressor pattern, an output of the register being coupled to the I/O buffer circuitry.

14. The article of claim 13 wherein the test unit is to launch the pattern onto the plurality of pins during a write mode, and compare the pattern to information elements captured from the plurality of pins during read mode.

15. The article of claim 11 wherein the component is one of a processor and a system chipset.

16. The article of claim 11 wherein the component is a package containing a plurality of integrated circuit dies.

17. The article of manufacture of claim 11 wherein the component is a single, integrated circuit die.

* * * * *